US005466161A

United States Patent [19]

[11] Patent Number: 5,466,161

[45] Date of Patent: Nov. 14, 1995

Yumibe et al.

[54] COMPLIANT STACKING CONNECTOR FOR PRINTED CIRCUIT BOARDS

[75] Inventors: George Yumibe, Huntington Beach; Paul Gratzinger, Moreno Valley; Thanh Nguyen, Pomona; Duane Wisner, Riverside, all of Calif.

[73] Assignee: Bourns, Inc., Riverside, Calif.

[21] Appl. No.: 360,471

[22] Filed: Dec. 21, 1994

Related U.S. Application Data

[62] Division of Ser. No. 131,257, Oct. 1, 1993, Pat. No. 5,378, 160.

[51] Int. Cl.$^{6}$ .......... H05K 1/00

[52] U.S. Cl. .......... 439/66; 439/65

[58] Field of Search .......... 439/65, 69, 71, 439/72, 74, 76, 83, 91, 66

[56] References Cited

U.S. PATENT DOCUMENTS

| | | | |
|---|---|---|---|
| 3,715,706 | 2/1973 | Michel et al. | 439/65 |
| 3,795,037 | 3/1974 | Luttmer | 29/268 |
| 4,161,346 | 7/1979 | Cherian et al. | 439/66 |
| 4,199,209 | 4/1980 | Cherian et al. . | |
| 4,295,700 | 10/1981 | Sado . | |
| 4,505,529 | 3/1985 | Barkus . | |
| 4,511,196 | 4/1985 | Schuler et al. . | |
| 4,738,625 | 4/1988 | Burton et al. | 439/59 |
| 4,806,104 | 2/1989 | Cabourne | 439/66 |
| 4,813,129 | 3/1989 | Karnezos | 29/832 |
| 4,927,569 | 5/1990 | Grabbe et al. | 439/66 |
| 4,983,126 | 1/1991 | Busse et al. | 439/61 |
| 4,998,886 | 3/1991 | Werner | 439/66 |
| 5,061,192 | 10/1991 | Chapin et al. | 439/66 |
| 5,069,627 | 12/1991 | Buck et al. | 439/66 |
| 5,139,427 | 8/1992 | Boyd et al. | 439/66 |
| 5,147,207 | 9/1992 | Mowry | 439/66 |
| 5,152,695 | 10/1992 | Grabbe et al. | 439/71 |
| 5,160,268 | 11/1992 | Hakamian | 439/66 |
| 5,173,055 | 12/1992 | Grabbe | 439/66 |
| 5,199,889 | 4/1993 | McDevitt, Jr. | 439/66 |
| 5,220,270 | 6/1993 | Peickert | 320/2 |
| 5,228,861 | 7/1993 | Grabbe | 439/66 |
| 5,259,777 | 11/1993 | Schader et al. | 439/188 |

OTHER PUBLICATIONS

Methode Electronics, Inc. Engineering Catalog, Connector Division, (1993), pp. 32J–45J.

*Primary Examiner*—Gary F. Paumen
*Assistant Examiner*—Hien D. Vu
*Attorney, Agent, or Firm*—Klein & Szekeres

[57] ABSTRACT

A device for electrically connecting the conductors on a first PC board to the conductors on a second PC board includes a housing having a mounting surface for mounting on the first board, an exposed surface opposite the mounting surface, and a pair of opposed side walls. A plurality of channels open through the exposed surface, each having an interior defined between the interior surfaces of the side walls. A compliant contact element, formed as an integral conductive element, is disposed in each channel. The contact element includes an end portion formed as a termination pad on the mounting surface, a lead portion extending from the first end portion along an adjacent side wall toward the exposed surface and then through the adjacent side wall and the interior surface of that wall into the interior of one of the channels, a supporting portion extending within the interior of the channel, and an electrical contact portion flexibly joined to the supporting portion and extending outwardly from the channel beyond the exposed surface so as to establish electrical contact with one of the conductors on the second board when the second board is located adjacent to the first board. In one embodiment, the electrical contact portion is flexibly joined to the support portion along an arcuate bend so as to form an acute angle therewith. In another embodiment, the electrical contact portion is a finger-shaped element flexibly joined on each side to a cantilevered supporting portion.

4 Claims, 4 Drawing Sheets

FIG. 1
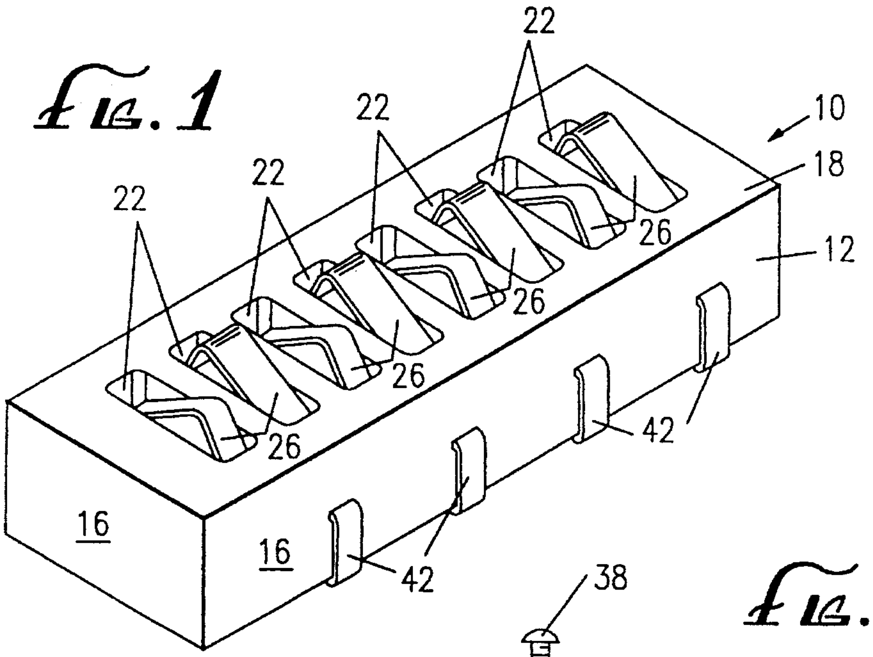
FIG. 2
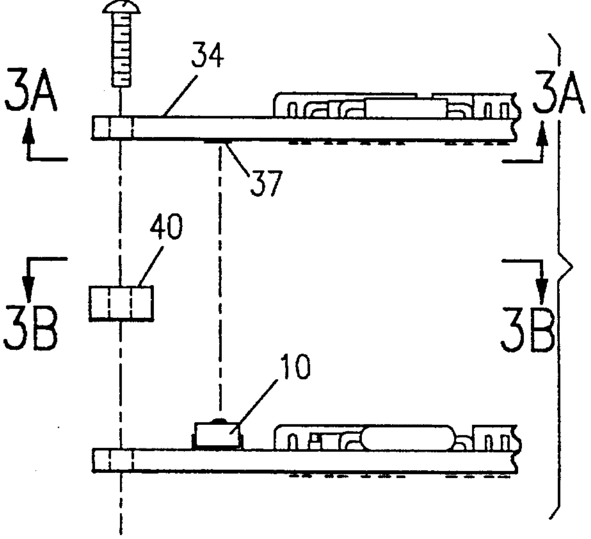
FIG. 3A
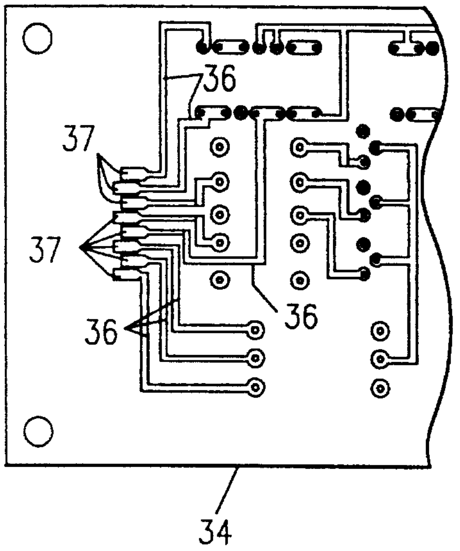
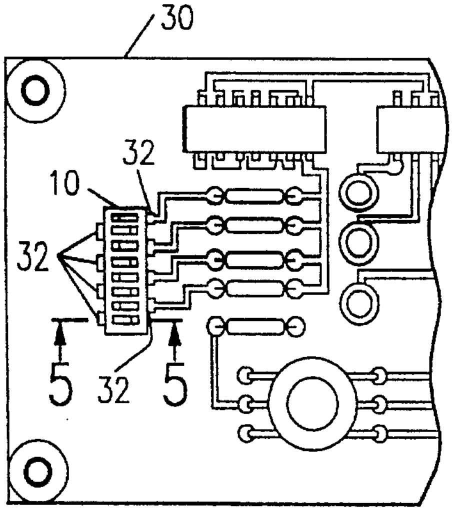
FIG. 3B

FIG. 10
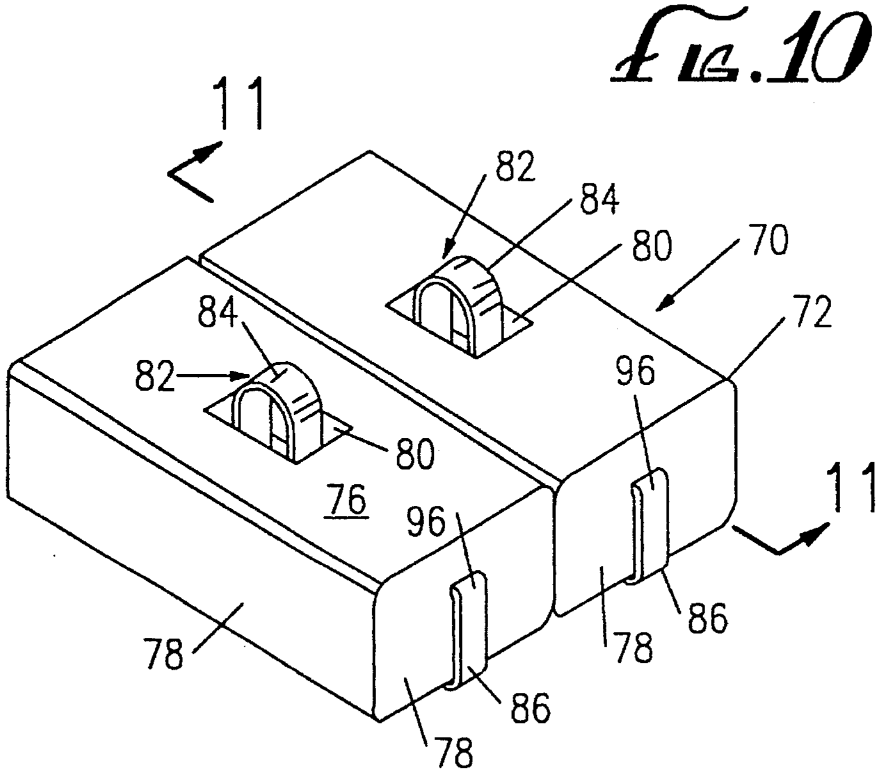
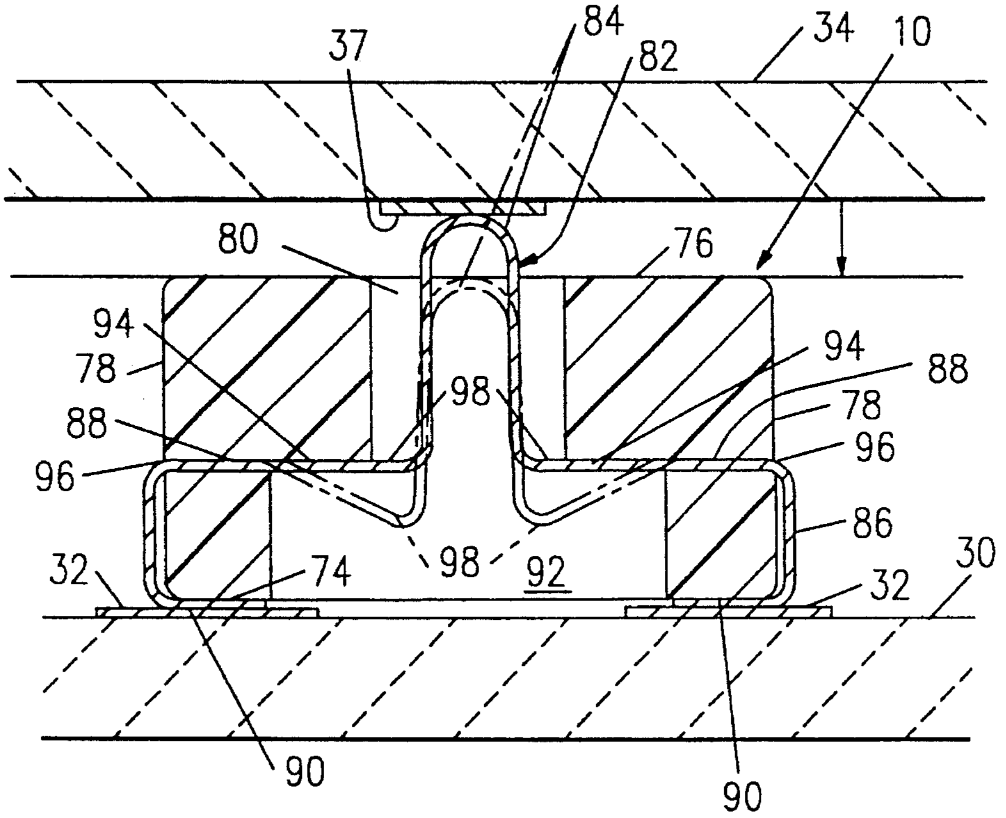
FIG. 11

COMPLIANT STACKING CONNECTOR FOR PRINTED CIRCUIT BOARDS

CROSS-REFERENCE TO RELATED APPLICATION

The present application is a divisional of application Ser. No. 08/131,257, filed on Oct. 1, 1993, issuing as U.S. Pat. No. 5,378,160.

BACKGROUND OF THE INVENTION

The present invention relates generally to the field of electrical connectors. More particularly, this invention relates to devices that provide electrical connection between the respective conductors on first and second adjacent substrates, such as printed circuit boards ("PC" boards).

The trend toward increased miniaturization and more compact packaging of components and assemblies in the electronics industry has led to the development of connectors for electrically connecting the respective conductors on adjacent substrates, such as the conductive traces on adjacent PC boards.

A particular application for such connector devices is for providing electrical connection between adjacent PC boards that are removably stacked relative to one another; that is, removably mounted in a closely adjacent parallel relationship. One typical type of connector for such an application employs resilient or compliant contact elements to provide the electrical connection between the respective conductive elements on the adjacent PC boards. Specific examples of this general type of connector are disclosed in the following U.S. Pat. Nos. 3,795,037—Luttmer; 4,199,209—Cherian et al.; 4,295,700—Sado; 4,505,529—Barkus; 4,511,196—Schuler et al.; 4,738,625—Burton et al.; 4,806,104—Cabourne; 4,813,129—Karnezos; 4,983,126—Busse et al; 4,998,886—Werner; 5,016,192—Chapin et al.; 5,069,627—Buck et al.; 5,139,427—Boyd et al.; 5,147,207—Mowry; 5,152,695—Grabbe et al.; 5,160,268—Hakamian; 5,173,055—Grabbe; and 5,228,861—Grabbe.

In designing PC board connectors, there are a number of important considerations. For example, to optimize space utilization, it is desirable to minimize the space between adjacent boards. Thus, the thickness or "profile" of the connector must be minimized. Also, since the trend is toward more ever smaller component sizes and increased density of the arrangement of the components and conductors on the boards, it is necessary to provide a denser arrangement of conductive contact elements in the connectors; that is, an increased number of contacts in a given area. Often, this means decreasing the size of the contact elements themselves. Such downsizing of the contact elements, however, frequently degrades their durability and useful lifetimes, due to decreased structural strength. Thus, the design criteria of minimizing size and maintaining durability typically operate at cross purposes, resulting in the compromising of both criteria.

Furthermore, there will be often be slight variations in the nominal spacing between adjacent PC boards, thereby requiring the contact elements to provide positive electrical contact regardless of such variations. To do this, the contact elements must have a sufficient degree of deflection or travel to bridge inter-board gaps of varying distances. One solution to this problem is to provide a structure in which the connector has some freedom to move or "float" between the boards, as disclosed in U.S. Pat. No. 5,160,268—Hakamian.

One drawback to this approach, however, is a relatively complex structure, that may be relatively costly to manufacture and difficult to install in some applications.

Another drawback with many prior art connectors is difficulty, awkwardness, or lack of flexibility in installation. Specifically, many such prior art connectors require specialized installation or mounting structures, and many do not easily permit (or even permit at all) relative lateral movement, or sliding, between two adjacent PC boards. In either case, the installation and removal of interconnected PC boards may require either additional clearance space, or more complex, time-consuming procedures.

Furthermore, many of the prior art connectors do not perform a wiping action against the stationary contacts of the adjacent PC board, thereby allowing debris and oxidation to accumulate, and thus degrading the performance of the connector over time.

Finally, many of the prior art connectors are relatively complex in construction, and therefore relatively expensive to manufacture.

Therefore, it would be a significant advancement in the art to provide a PC board connector that combines a low profile, a high contact element density, good contact element durability, extended contact element travel with a wiping action, simplicity and flexibility in installation, and economy of manufacture.

SUMMARY OF THE INVENTION

Broadly, the present invention is a PC board connector, comprising a housing with terminal leads that are conductively attachable to conductive trace terminations on a first PC board, and that contains a multiplicity of compliant spring contact elements, each of which is individually mounted in the housing for resilient, wiping contact with a stationary contact pad on an adjacent PC board. The contact elements are integral extensions of the terminal leads, each of which extends into the housing and is bent so as to have an intermediate portion that normally extends outwardly from the plane of the exposed surface of the housing opposite the PC board on which the housing is mounted. The bent shape of each contact element provides it with a resilient spring action, whereby the contact element is biased against the stationary contact pad.

In a preferred embodiment, the contact elements are disposed in a linear array in the housing, each extending outwardly from an individual slot-like channel in the exposed housing surface. Each contact element is, as mentioned above, an extension of a terminal lead, and the terminal leads are arranged along opposed lateral sides of the housing in a staggered relationship for higher contact element density. Specifically, in a surface mount embodiment, each terminal lead has a first end formed as a termination pad on the board-mounted surface (underside) of the housing. From the pad, the lead extends part way up the adjacent lateral side wall of the housing, and then through the wall into the bottom of the channel in the interior of the housing to form the spring contact element. In the interior of the housing, the contact element has a supporting portion or base that extends along the bottom of the channel toward the interior of the opposite lateral side wall. Before reaching the opposite wall, the contact is bent in an arcuate bend to form a resilient intermediate portion that extends, at an acute angle with the base, outwardly from the opening of the channel in the exposed surface of the housing. The contact element is then bent back, in a right angle or a slightly acute angle, toward the exposed surface of the housing, to form a second end or "tail" that extends back slightly into the channel as a guide for maintaining the optimum alignment of the contact element with respect to the channel.

The angular junction between the intermediate portion of the contact element and the tail forms a rounded "knuckle" that provides the major contact surface for establishing a conductive, wiping contact with a stationary contact pad on a second PC board placed adjacent to the first PC board.

When the second PC board is placed adjacent to the first PC board, each of the stationary contact pads on the second board is placed in a resilient or compliant compression contact with the raised knuckle surface of a corresponding one of the compliant contact elements, thereby resiliently compressing the compliant contact elements into the corresponding channels in the housing. The compression of the compliant contact elements creates a spring-biased loading that urges them into a secure electrical contact with their corresponding stationary contact pads.

The bent configuration of the compliant contact elements provides sufficient travel to allow the accommodation of varying distances between adjacent PC boards. In addition, the formation of the compliant contact elements as integral extensions of the terminal leads provides structural strength, durability, compactness, and simplicity of manufacture.

In a variation of the preferred embodiment, there is a clearance space between the base of the contact element and the bottom of the channel. This clearance space allows both the base and the intermediate portion of the contact element to bend, thereby providing an additional amount of travel for the contact element, as well as additional contact force.

The present invention may be used to provide electrical contact either with exposed stationary contact pads on the second board, or with contact pads that are enclosed in a second housing and that are accessed through slots in the exposed surface of the second housing.

In an alternative embodiment, the compliant contact element comprises a resilient conductive element configured as a finger protruding from an aperture in the exposed surface of the housing. The finger is formed in the intermediate portion of a continuous terminal lead, at least one end of which extends through the side wall of the housing, and then down onto the underside (mounting side) of the housing to form a lead termination pad for attachment to the first PC board. The terminal lead is secured within the housing so that both sides of the finger are, in effect, cantilevered, to provide the compliant spring action described above.

The present invention provides a unique combination of a number of advantages. For example, as mentioned above, the invention combines high contact density, good contact strength and durability, excellent adaptability to variances in nominal inter-board spacing, compact dimensions, and simplicity of manufacture. These and other advantages will be better appreciated from the detailed description that follows.

BRIEF DESCRIPTION OF THE DRAWINGS

FIG. 1 is top perspective view of a compliant contact connector in accordance with a preferred embodiment of the present invention;

FIG. 2 is an exploded side elevational view of first and second PC boards prior to mechanical and electrical interconnection, the first (lower) PC board having mounted on it the connector of FIG. 1;

FIG. 3a is a plan view, taken along line 3a—3a of FIG. 2, of the second (upper) PC board shown in FIG. 2;

FIG. 3b is a plan view, taken along line 3b—3b of FIG. 2, of the first (lower) PC board shown in FIG. 2, showing the connector of FIG. 1 mounted thereon;

FIG. 10 is a top perspective view of a compliant contact connector in accordance with an alternative embodiment of the present invention; and FIG. 11 is a cross-sectional view, taken along line 11 of FIG. 10, showing the placement of a second PC board adjacent to the first PC board on which the connector is mounted, and showing, in phantom, the deflection of a compliant contact element in response to the interconnection of the first and second boards.

DETAILED DESCRIPTION OF THE INVENTION

Figure 4:
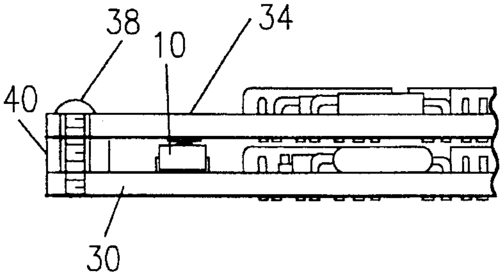
FIG. 4 is a side elevational view, similar to that of FIG. 2, showing the first and second PC boards interconnected.
Figure 5:
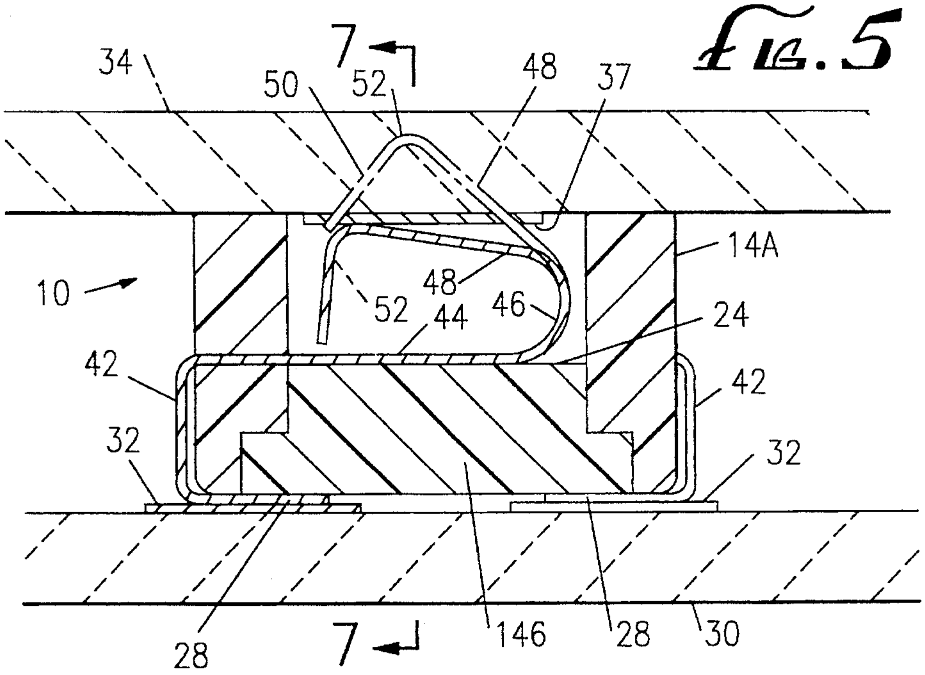
FIG. 5 is an enlarged cross-sectional view taken along line 5—5 of FIG. 3b, showing, in phantom, the second PC board and the position of a compliant contact element in the connector when the second PC board is installed adjacent to the first PC board, as shown in FIG. 4.
Figure 6:
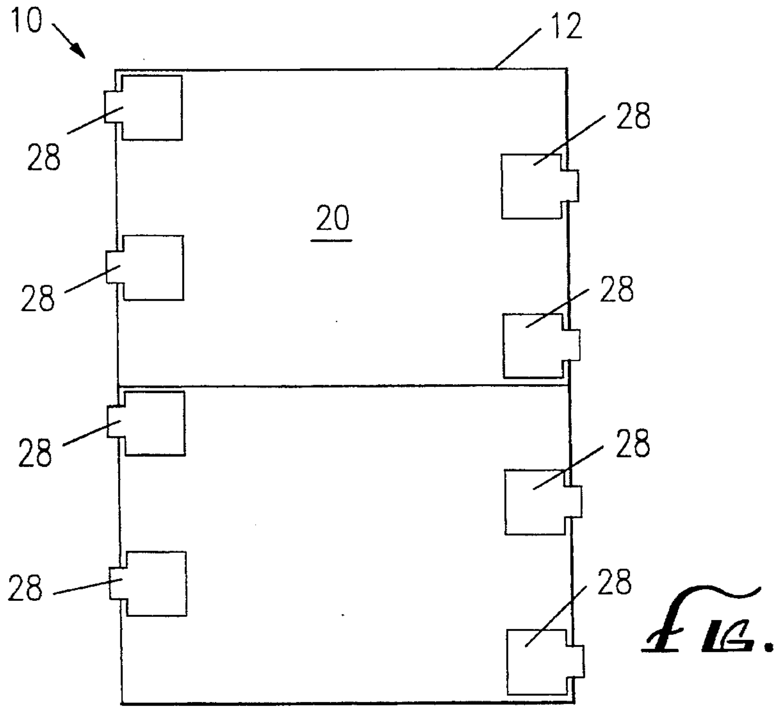
FIG. 6 is a bottom plan view of the connector shown in FIG. 1.

Referring now to the drawings, FIGS. 1 through 7 show a compliant contact connector 10, in accordance with a preferred embodiment of the invention. The connector 10 includes a housing 12, formed of a suitable insulative material, such as a molded thermoplastic. The housing 12 may be formed as one unitary piece, or, as shown in FIG. 5, it may comprise a first and second housing portions 14a, 14b, respectively. The first housing portion 14a includes side walls 16 and an exposed apertured surface 18, which, for purposes of the description herein, may be termed the "upper" surface (although the orientation in practice will vary). The second housing portion 14b forms a mounting surface, or "lower" surface 20, opposite the upper surface 18. The lower surface 20, as best shown in FIG. 6, is substantially planar, so as to be mountable substantially flush against a PC board, as will be described below.

The first housing portion 14a has a linear array of laterally-extending slot-like apertures or channels 22 that extend through the upper surface 18 into the interior of the housing 12. Each channel has an interior bottom surface 24 defined by the planar interior surface of the second housing portion 14b, as shown in FIG. 5. As will be described in detail below, each of the channels 22 accommodates a single corresponding compliant contact element 26, and each of the contact elements 26 is integral with a termination pad 28 on the lower surface 20.

As will be described in detail below, the connector 10 is used to provide electrical interconnection between two adjacent PC boards. Thus, as shown in FIGS. 2, 3a, 3b, and 4, the connector 10 is mounted on a first PC board 30 so that the termination pads 28 on the lower surface 20 thereof make electrical contact with a first plurality of conductive traces 32 printed thereon. When a second PC board 34, having printed thereon a second plurality of conductive traces 36, each terminating in a stationary contact pad 37, is brought adjacent to the first board 30 and mechanically connected thereto (such as by screws 38 and spacer nuts 40, one each of which is shown in the drawings), each of the compliant contact elements 26 protruding from the upper surface 18 of the connector 10 will establish electrical contact with a corresponding one of the stationary contact pads 37.

Figure 7:
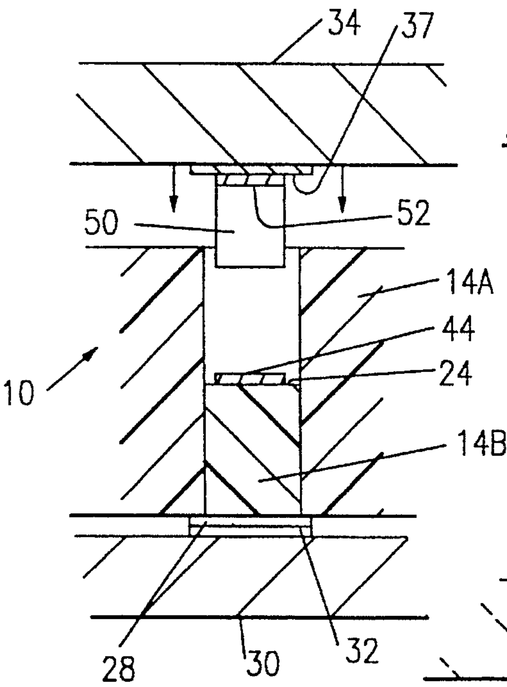
FIG. 7 is a cross-sectional view taken along line 7—7 of FIG. 5.

As shown in FIGS. 5 and 7, each of the compliant contact elements 26 is an integral extension of a terminal lead 42. The terminal leads 42 are arranged along opposed lateral sides 16 of the housing 12, in a staggered relationship for closer contact element spacing and thus higher contact element density. In the surface mount embodiment shown, each terminal lead 42 has a first end portion formed as one of the termination pads 28 on the mounting or lower surface 20 of the connector housing 12. Alternatively, the first end portions of the terminal leads may configured for insertion through holes in the PC board. From the pad 28, each lead 42 extends part way up the adjacent housing lateral side wall 16, and then through the side wall into and along the bottom surface 24 of a channel 22, forming a supporting portion or base 44 for the compliant contact element 26. The base 44 extends toward the interior surface of the opposite lateral side wall 16, but before reaching the opposite wall, the contact element is formed into an arcuate bend 46 to form a resilient intermediate portion 48 that extends, at an acute angle with the base 44, outwardly from the opening of the channel 22 in the upper surface 18 of the housing 12. The contact element is then bent back, at a right angle or a slightly acute angle, toward the upper housing surface 18, to form a second end portion or "tail" 50 that extends back slightly into the channel 22 as a guide for maintaining the optimum alignment of the contact element 26 with respect to the channel 22.

The tail 50 and the intermediate portion 48 form an electrical contact portion, with the angular junction between the tail 50 and the intermediate portion 48 of the contact element 26 formed as a rounded protuberance or "knuckle" 52 that provides the major contact surface for establishing a wiping conductive contact with one of the stationary contact pads 37 on the second PC board 34.

When the second PC board 34 is placed adjacent to the first PC board 30, each of the stationary contact pads 37 on the second board 34 is placed in a resilient or compliant compression contact with the protruding knuckle 52 of a corresponding one of the compliant contact elements 26, thereby resiliently compressing the compliant contact elements 26 into the corresponding channels 22 in the housing 12. The compression of the compliant contact elements 26 creates a spring-biased loading that urges them into a secure electrical contact with their corresponding stationary contact pads 37.

The bent configuration of the compliant contact elements 26 provides sufficient travel to allow the accommodation of varying distances between adjacent PC boards. In addition, the formation of the compliant contact elements 26 as integral extensions of the terminal leads 42 provides structural strength, durability, compactness, and simplicity of manufacture.

Figure 8:
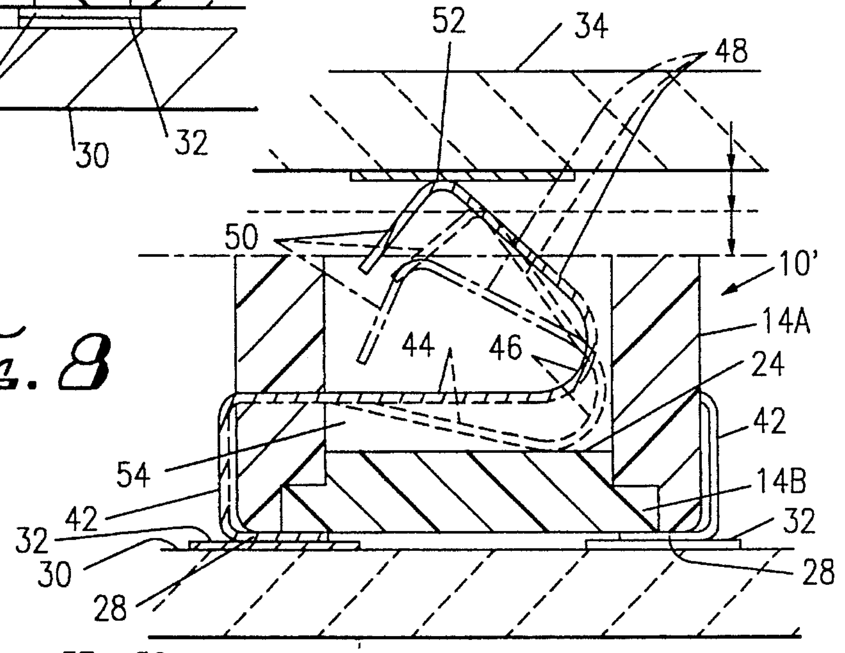
FIG. 8 is a view similar to that of FIG. 5, showing a variation of the preferred embodiment of the connector.

In a variation of the preferred embodiment, shown in FIG. 8, the interior of a connector 10' is configured so that there is a clearance space 54 between the base 44 of the contact element 26 and the bottom surface 24 of the channel 22. This clearance space 54 allows both the base 44 and the intermediate portion 48 of the contact element 26 to bend, thereby providing an additional amount of travel for the contact element. In this modification, a resilient spring action is provided not only at the arcuate bend 46, but also at the juncture between the base portion 44 and the interior of the housing. This "double spring action" increases the compliance of the connector element, and can, in some applications, increase its useful lifetime.

Figure 9:
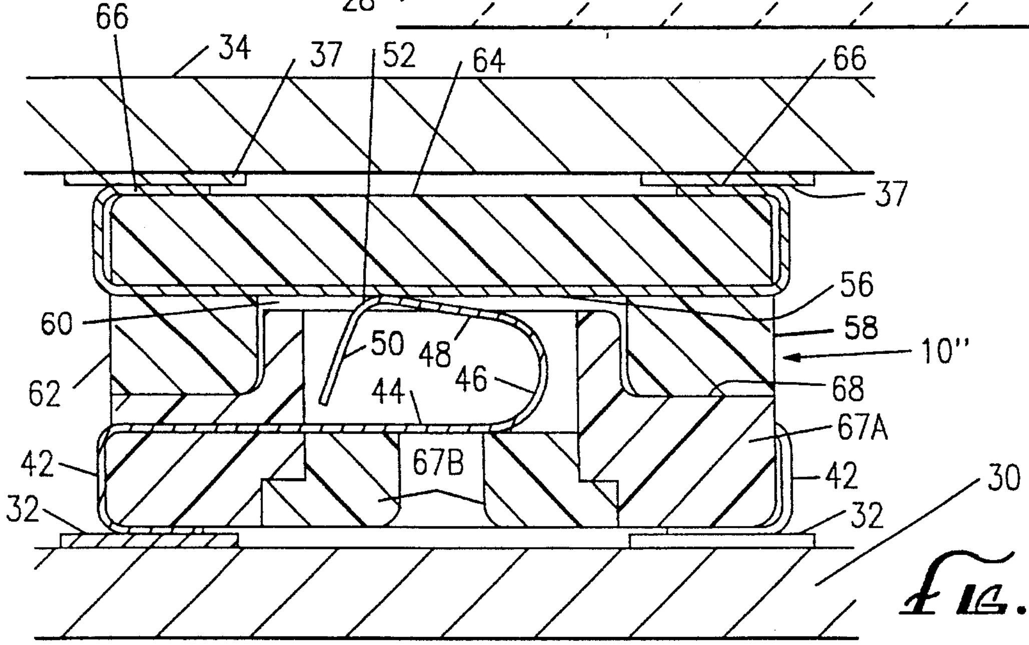
FIG. 9 is cross-sectional view, similar to that of FIG. 5, but showing the compliant contact element in contact with a partially enclosed stationary contact pad on the second PC board.

The present invention may used to provide electrical contact either with exposed stationary contact pads 37 on the second board 34, as described above, or with partially enclosed stationary contact pads 56, as shown in FIG. 9. In this configuration, the stationary contact pads 56 are partially enclosed in a second housing 58, and they are each accessed through a slot 60 in a slotted portion 62 of the second housing 58. As shown in FIG. 9, each of the partially enclosed contact pads 56 may be an exposed portion of a continuous conductive strip, at least one of the ends of which may be bent around to the underside (mounting surface) 64 of the second housing 58 to form a termination pad 66.

In the configuration shown in FIG. 9, a modified connector 10" is employed, which includes a housing comprising an exterior housing portion *67a* and an interior housing portion *67b*. The exterior housing portion *67a* forms the sides and the lateral portions of the lower (mounting) surface of the connector 10". The exterior housing portion *67a* also defines a pair of opposed recessed shoulders 68 on opposite ends of each channel 22. The shoulders 68 provide a surface for receiving a corresponding mating surface on the slotted portion 62 of the second housing 58, thereby facilitating the proper alignment of the contact elements 26 in the connector 10" with the corresponding contact pads 56 in the second housing 58.

The interior housing portion *67b* provides the central portion of the lower (mounting) surface of the connector 10", while also providing an internal support surface for the contact element base portion 44.

An alternative embodiment of the invention is shown in FIGS. 10 and 11. In accordance with this alternative embodiment, which may be used in applications where a lower contact density is desired, a connector 70 comprises a one-piece molded plastic housing 72 having a lower or mounting surface 74 and an upper or exposed surface 76 joined by a plurality of sides 78. The upper surface 76 is provided with one or more apertures or channels 80 advantageously in alignment as shown.

In this alternative embodiment, a compliant contact element 82 is employed that comprises a resilient conductive element configured as a round-tipped finger 84 protruding from each of the channels 80 in the exposed surface 76 of the housing 72. The finger 84 is formed in the intermediate portion of a continuous terminal lead 86, at least one end 88 of which extends through an adjacent side 78 of the housing 72, and then down onto the underside (mounting side) 74 of the housing 72 to form a lead termination pad 90 for attachment to the first PC board 30.

The terminal lead 86 is secured within the housing 72 so that both sides of the finger 84 are, in effect, cantilevered, to provide the compliant spring action described above with respect to the preferred embodiment. Specifically, each of the channels 80 extends into the interior of the housing 72 and communicates with a hollowed out cavity 92 in the bottom portion thereof. The width of the cavity 92 is greater than that of the channel 80, so that the interior wall surfaces of the housing 72 form an opposed pair of horizontal shoulders 94 opposite sides of the channel 80. Each of the leads 86 is molded into the housing 70, and enters the interior of the housing at an entry point 96 in each of two opposed sides of the housing. Inside the housing, the leads 86 form an opposed pair of supporting or base portions 98, the upper sides of which seat against the shoulders 94, and the lower sides of which are unconstrained, thereby allowing the supporting portions 98 to flex inwardly into the cavity 92.

When a second PC board 34 is installed adjacent to the first PC board 30 on which the connector 70 is mounted, each of the stationary contact pads 37 on the second board 34 establishes electrical contact with the rounded end of a corresponding one of the fingers 84. In doing so, the stationary contact pad 37 is placed in a resilient or compliant compression contact with the tip of the finger 84, thereby resiliently compressing the compliant contact element 82 into its corresponding channel 80. The flexing of the cantilevered support portions 98 of the contact elements 82 creates the above-described spring-biased loading that establishes a secure electrical contact between each of the contact elements 82 and its associated stationary contact pad 37.

From the foregoing description, it can be seen that the present invention provides a unique combination of advantages as compared with prior art PC board connectors. Many of these advantages have been mentioned above, but, to summarize, they include a low profile, high contact density (at least for the preferred embodiment), good contact element durability, extended contact element travel (to accommodate variations in PC board spacing), good wiping action against the stationary contact pads, simplicity and flexibility in installation, and simplicity and economy of manufacture. Furthermore, the present invention requires no specialized installation or mounting structures, and (especially, but not exclusively, in the alternative embodiment of FIGS. 10 and 11) it permits relative lateral movement or sliding between two adjacent PC boards, thereby providing further flexibility in installation.

While a preferred embodiment (with several variations) and a single alternative embodiment have been described, it should be appreciated that further modifications and variations may suggest themselves to those skilled in the pertinent arts. For example, the number of compliant contact elements in a connector may be varied to suit different applications, as can be the arrangement of the contact elements. As mentioned above, the terminal leads (the extensions of which form the compliant contact elements) can be configured both for surface mount applications and for through-board applications. The housing itself can assume a wide variety of sizes and configurations to fit a multitude of applications. Furthermore, the precise shape of the compliant contact elements themselves may be varied from the idealized forms shown in the drawings, if such variations are consistent with the concept of a highly compliant contact element that is an integral extension of the terminal lead. These and other variations and modifications that may suggest themselves to those of ordinary skill in the art should be considered within the spirit and scope of the invention, as defined in the claims that follow.

What is claimed is:

1. A device for electrically connecting a first plurality of conductors on a first printed circuit board to a second plurality of conductors on a second printed circuit board, comprising:

a housing having a mounting surface configured to be mounted on the first printed circuit board, an exposed surface opposite the mounting surface, and at least one opposed pair of side walls extending between the mounting surface and the exposed surface, the side walls each having an interior wall surface;

a plurality of channels opening through the exposed surface, each of the channels having an interior defined between the interior wall surfaces of the side walls; and a plurality of compliant contact elements mounted in the housing, each of the contact elements formed as an integral conductive element, comprising:

a first end portion disposed adjacent to the mounting surface so as to establish electrical contact with one of the first plurality of conductors when the housing is mounted on the first printed circuit board;

a lead portion extending from the first end portion along an adjacent one of the side walls toward the exposed surface and then through the adjacent side wall and the interior wall surface of that wall into the interior of an adjacent one of the channels;

a supporting portion extending within the interior of the adjacent one of the channels; and a substantially finger-shaped portion having at least one side flexibly joined to the supporting portion, the finger-shaped portion having a rounded tip and extending outwardly from the adjacent one of the channels beyond the exposed surface so as to establish electrical contact between the tip and a corresponding one of the second plurality of conductors when the second printed circuit board is located adjacent to the first printed circuit board.

2. The device of claim 1, wherein the finger-shaped portion is supported within the housing by the supporting portion, and wherein the supporting portion is mounted within the housing so as to be cantilevered, whereby the supporting portion flexes inwardly toward the mounting surface in response to the compression of the tip of the finger-shaped portion.

3. The device of claim 2, wherein the supporting portion is a first supporting portion that provides cantilevered support for a first side of the finger-shaped portion in a first one of the interior wall surfaces, and wherein each of the compliant contact elements further comprises a second supporting portion that provides cantilevered support for a second side of the finger-shaped portion in a second one of the interior wall surfaces.

4. The device of claim 3, wherein the interior wall surfaces define an opposed pair of horizontal shoulders within the housing on opposite sides of the channel, and wherein each of the supporting portions has an upper surface seated against an adjacent one of the shoulders.

* * * * *